United States Patent
Chou et al.

(10) Patent No.: US 10,490,297 B2
(45) Date of Patent: Nov. 26, 2019

(54) MEMORY STORAGE APPARATUS AND METHOD FOR TESTING MEMORY STORAGE APPARATUS

(71) Applicant: Winbond Electronics Corp., Taichung (TW)

(72) Inventors: Chuan-Sheng Chou, Taichung (TW); Meng-Hung Lin, Taichung (TW); Bo-Lun Wu, Taichung (TW); Chia-Hua Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/683,733

(22) Filed: Aug. 22, 2017

(65) Prior Publication Data

US 2018/0374558 A1 Dec. 27, 2018

(30) Foreign Application Priority Data

Jun. 27, 2017 (CN) .......................... 2017 1 0498769

(51) Int. Cl.
*G11C 29/00* (2006.01)
*G11C 29/50* (2006.01)

(52) U.S. Cl.
CPC ...... *G11C 29/50* (2013.01); *G11C 2029/5006* (2013.01)

(58) Field of Classification Search
CPC .................... G11C 29/50; G11C 2029/5006
See application file for complete search history.

(56) References Cited

U.S. PATENT DOCUMENTS

| 9,263,129 | B2 | 2/2016 | Cabout et al. | |
| 9,443,587 | B1 | 9/2016 | Chen et al. | |
| 9,508,435 | B1 | 11/2016 | Chen et al. | |
| 2011/0063888 | A1* | 3/2011 | Chi ..................... | G11C 11/5685 365/148 |
| 2012/0275222 | A1* | 11/2012 | Choi .................. | G11C 16/3459 365/185.09 |

(Continued)

FOREIGN PATENT DOCUMENTS

| CN | 102610272 | 7/2012 |
| TW | I422025 | 1/2014 |
| TW | 201715525 | 5/2017 |

OTHER PUBLICATIONS

"Office Action of Taiwan Counterpart Application", dated Aug. 21, 2018, p. 1-p. 5.

*Primary Examiner* — Samir W Rizk
(74) *Attorney, Agent, or Firm* — JCIPRNET

(57) ABSTRACT

A memory storage apparatus including a memory cell array and a memory control circuit is provided. The memory cell array includes a plurality of memory cells. The memory cell array is configured to store data. The memory control circuit is coupled to the memory cell array. The memory control circuit is configured to apply one of a set signal and a reset signal to a target memory cell among the memory cells to generate a read current. The memory control circuit receives a read current of the target memory cell. The memory control circuit compares the read current with a reference current. The memory control circuit determines whether the target memory cell is failed according to a comparison result. In addition, a method for testing a memory storage apparatus is also provided.

16 Claims, 3 Drawing Sheets

(56) References Cited

U.S. PATENT DOCUMENTS

2013/0235649 A1* 9/2013 Lindstadt ........... G11C 13/0035
　　　　　　　　　　　　　　　　　　　　　　365/148
2016/0093349 A1* 3/2016 Andre ................. G11C 11/1677
　　　　　　　　　　　　　　　　　　　　　　365/158
2017/0301399 A1* 10/2017 Han ..................... G11C 13/004

* cited by examiner

MEMORY STORAGE APPARATUS AND METHOD FOR TESTING MEMORY STORAGE APPARATUS

CROSS-REFERENCE TO RELATED APPLICATION

This application claims the priority benefit of Chinese application serial no. 201710498769.4, filed on Jun. 27, 2017. The entirety of the above-mentioned patent application is hereby incorporated by reference herein and made a part of this specification.

BACKGROUND OF THE INVENTION

1. Field of the Invention

The invention relates to an electronic apparatus and a method for testing the same, and more particularly, to a memory storage apparatus and a method for testing the memory storage apparatus.

2. Description of Related Art

Currently, a resistive random access memory (RRAM) is a non-volatile memory under positive developments in the industry, which has advantages including low writing operation voltage, short write/erase time, long memorizing time, non-destructive read, multi-state memory, simple structure, less required area and so on.

In general, a resistive memory can change a width of a filament path according to magnitude and polarity of a pulse voltage being applied. By doing so, a resistance can be set in a reversible and non-volatile manner to LRS or HRS for representing stored data with different logic levels. For instance, when data of logic 1 is to be written, the width of the filament path may be narrowed by applying a RESET pulse so as to form the high resistance state. When data of logic 0 is to be written, the width of the filament path may be increased by applying a SET pulse with the opposite polarity so to form the low resistance state. In this way, when the data are to be read, the data of logic 1 or logic 0 can be read according to read currents in different size ranges generated under different resistance states.

However, due to the process variation, part of memory cells may not be able to reliably ensure the correctness of the data stored within. Accordingly, providing a memory storage apparatus and a method for testing the same, which are capable of improving endurance and retention of the memory storage apparatus as well as reliability of memory cells, is one of important issues to be solved by persons skilled in the art.

SUMMARY OF THE INVENTION

The invention is directed to a memory storage apparatus and a method for testing the same, which are capable of improving endurance and retention of the memory storage apparatus as well as reliability of memory cells.

A memory storage apparatus of the invention includes a memory cell array and a memory control circuit. The memory cell array includes a plurality of memory cells. The memory cell array is configured to store data. The memory control circuit is coupled to the memory cell array. The memory control circuit is configured to apply one of a set signal and a reset signal to a target memory cell among the memory cells to generate a read current. The memory control circuit receives a read current of the target memory cell. The memory control circuit compares the read current with a reference current. The memory control circuit determines whether the target memory cell is failed according to a comparison result.

A method for testing a memory storage apparatus of the invention includes: applying one of a set signal and a reset signal to a target memory cell among the memory cells to generate a read current; receiving the read current of the target memory cell, and comparing the read current with a reference current; and determining whether the target memory cell is failed according to a comparison result.

Based on the above, in the exemplary embodiments of the invention, the memory control circuit determines whether the target memory cell is failed according to the comparison result so as to improve endurance and retention of the memory storage apparatus as well as reliability of memory cells.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
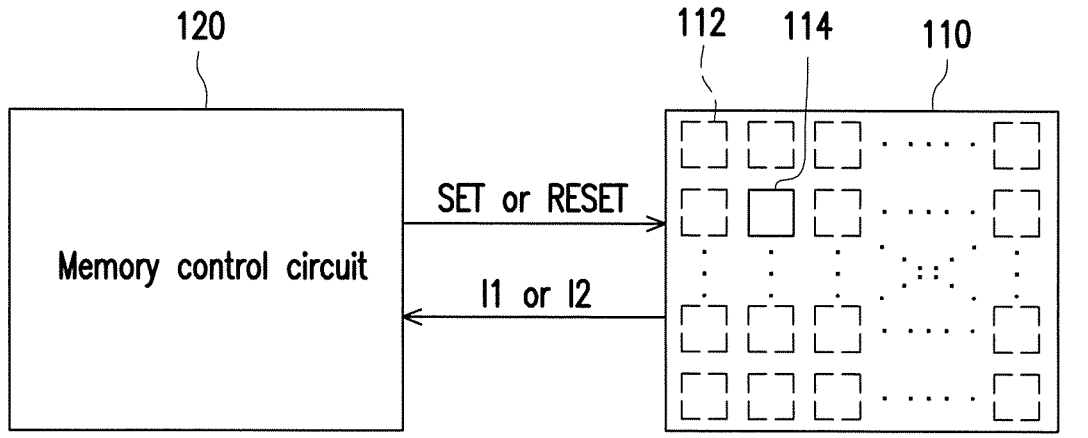
FIG. 1 illustrates a schematic diagram of a memory storage apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments are provided below to describe the invention in detail, though the invention is not limited to the provided embodiments, and the provided embodiments can be suitably combined. The term "coupling/coupled" used in this specification (including claims) of the present application may refer to any direct or indirect connection means. For example, "a first device is coupled to a second device" should be interpreted as "the first device is directly connected to the second device" or "the first device is indirectly connected to the second device through other devices or connection means."

Figure 2:
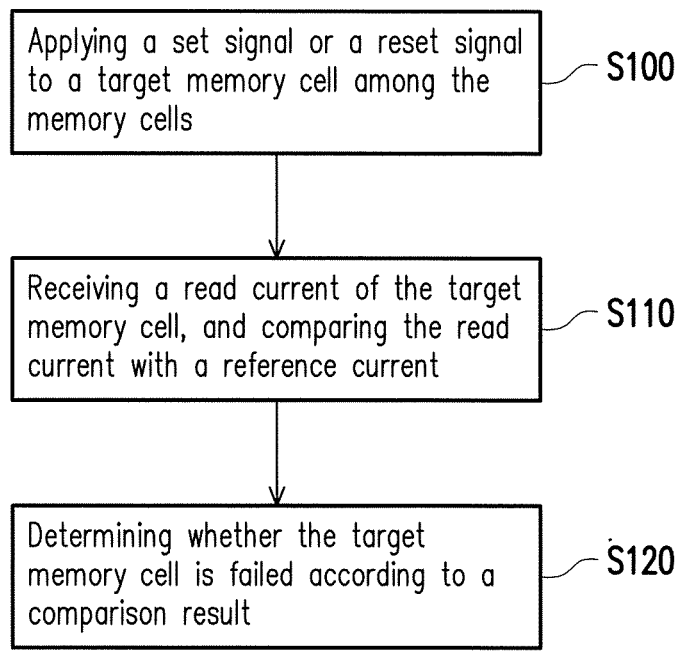
FIG. 2 is a flowchart illustrating steps in a method for testing a memory storage apparatus according to an embodiment of the invention.

FIG. 1 illustrates a schematic diagram of a memory storage apparatus according to an embodiment of the invention. FIG. 2 is a flowchart illustrating steps in a method for testing a memory storage apparatus according to an embodiment of the invention. With reference to FIG. 1 and FIG. 2, a memory storage apparatus 100 of the present embodiment includes a memory cell array 110 and a memory control circuit 120. The memory control circuit 120 is coupled to the memory cell array 110. The memory cell array 110 includes a plurality of memory cells 112 and is configured to store data. The memory control circuit 120 is configured to control data access of the memory cell array 110. In the present embodiment, the memory control circuit 120 includes, for example, any circuit suitable for collaboration in control of data access with internal structure implemented by any suitable circuit structure in the related art, which is not particularly limited by the invention. Enough teaching, suggestion, and implementation illustration for aforesaid circuit structure may be obtained with reference to common knowledge in the related art.

A method for testing a memory storage apparatus is at least applicable to the memory storage apparatus 100 of FIG. 1. Each step in the method for testing of the present embodiment will be described below with reference to each element in the memory storage apparatus 100. In step S100, the memory control circuit 120 is configured to apply one of a set signal SET and a reset signal RESET to a target memory cell 114 among the memory cells 112 to generate a read current, and a read current value thereof is, for example, a first read current value I1 obtained when the set signal SET is applied, or a second read current value I2 obtained when the reset signal RESET is applied. In the present embodiment, the target memory cell 114 is, for example, any one memory cell among the memory cells 112 or a memory cell set and selected in advance.

In step S110, the memory control circuit 120 receives the read current of the target memory cell 114, and compares the current values of the read current and a reference current. In the present embodiment, when the memory control circuit 120 applies the set signal SET to the target memory cell 114, the current value of the read current is, for example, the first read current value I1. In this case, the value of the read current to be compared with the first read current value I1 is, for example, a first reference current value Iref1. On the other hand, when the memory control circuit 120 applies the reset signal RESET to the target memory cell 114, the current value of the read current is, for example, the second read current value I2. In this case, the value of the read current to be compared with the second read current value I2 is, for example, a second reference current value Iref2. Therefore, in step S110, the memory control circuit 120 compares the first read current value I1 with the first reference value Iref1, or compares the second read current value I2 with the second reference value Iref2, for example.

In step S120, the memory control circuit 120 determines whether the target memory cell 114 is failed according to a comparison result. Said comparison result includes a size relation between the read current value and the reference current value. In the present embodiment, the memory control circuit 120 can continue to test a part of the memory cells or all of the memory cells among the memory cells 112 so as to determine whether the other target memory cells 114 are failed. The memory cells determined as failed is screen out and unused in the subsequent data access being performed, so as to improve endurance and retention of the memory storage apparatus 100 overall as well as reliability of memory cells 112.

At least one embodiment is provided below for personal skilled in the art to further understand the invention more clearly.

Figure 3:
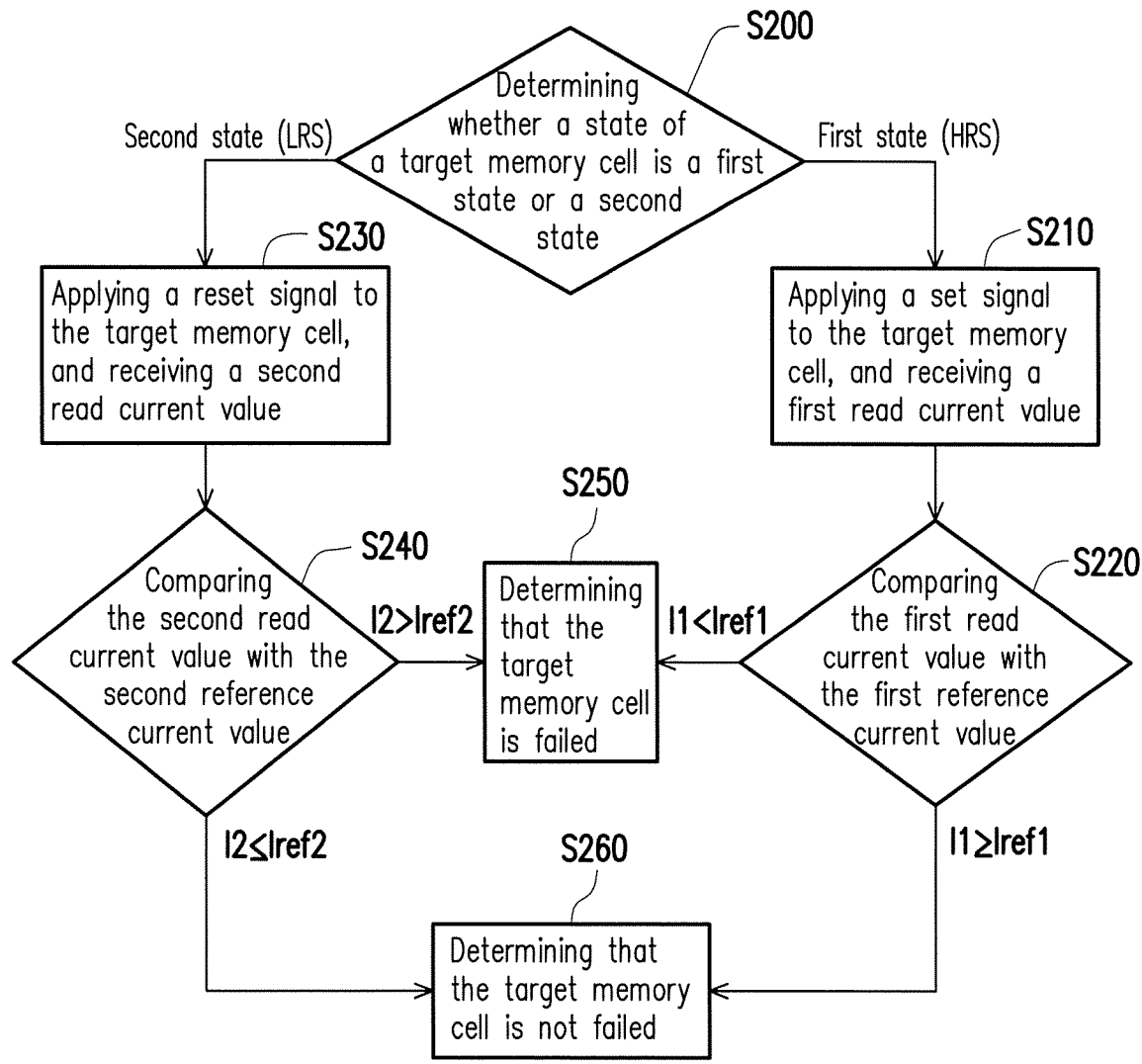
FIG. 3 is a flowchart illustrating steps in a method for testing a memory storage apparatus according to another embodiment of the invention.

FIG. 3 is a flowchart illustrating steps in a method for testing a memory storage apparatus according to another embodiment of the invention. A method for testing a memory storage apparatus is at least applicable to the memory storage apparatus 100 of FIG. 1. Each step in the method for testing of the present embodiment will be described below with reference to each element in the memory storage apparatus 100. In step S200, the memory control circuit 120 determines whether a state of the target memory cell 114 is a first state or a second state. In the present embodiment, the first state is, for example, HRS (high resistance state) and the second state is, for example, LRS (low resistance state).

In step S200, if the state of the target memory cell 114 is determined as the first state, the memory control circuit 120 performs step S210. In step S210, the memory control circuit 120 applies the set signal SET to the target memory cell 114. In this case, the target memory cell 114 changes from the first state to the second state. Also, in step S210, the memory control circuit 120 receives the read current having the first read current value I1 from the target memory cell 114. In step S220, the memory control circuit 120 compares the first read current value I1 with the first reference current value Iref1.

In step S220, upon comparison, if the first read current value I1 is less than the first reference current value Iref1 (i.e., I1<Iref1), the memory control circuit 120 performs step S250 and determines that the target memory cell 114 is failed. In the present embodiment, the memory cells determined as failed is screen out and unused in the subsequent data access being performed, so as to improve endurance and retention of the memory storage apparatus 100 overall as well as reliability of memory cells. In step S220, upon comparison, if the first read current value I1 is greater than or equal to the first reference current value Iref1 (i.e., I1≥Iref1), the memory control circuit 120 performs step S260 and determines that the target memory cell 114 is not failed.

In step S200, if the state of the target memory cell 114 is determined as the second state, the memory control circuit 120 performs step S230. In step S230, the memory control circuit 120 applies the reset signal RESET to the target memory cell 114. In this case, the target memory cell 114 changes from the second state to the first state. Also, in step S230, the memory control circuit 120 receives the read current having the second read current value I2 from the target memory cell 114. In step S240, the memory control circuit 120 compares the second read current value I2 with the second reference current value Iref2.

In step S240, upon comparison, if the second read current value I2 is greater than the second reference current value Iref2 (i.e., I2>Iref2), the memory control circuit 120 performs step S250 and determines that the target memory cell 114 is failed. In the present embodiment, the second reference current value Iref2 is less than the first reference current value Iref1. In the present embodiment, the memory cells determined as failed is screen out and unused in the subsequent data access being performed, so as to improve endurance and retention of the memory storage apparatus 100 overall as well as reliability of memory cells. In step S240, upon comparison, if the second read current value I2 is less than or equal to the second reference current value Iref2 (i.e., I2≤Iref2), the memory control circuit 120 performs step S260 and determines that the target memory cell 114 is not failed.

In addition, sufficient teaching, suggestion, and implementation illustration regarding the method for testing the memory storage apparatus in the embodiments of the invention may be obtained from the above embodiments depicted in FIG. 1 to FIG. 2, and thus related description thereof is not repeated hereinafter.

Figure 4:
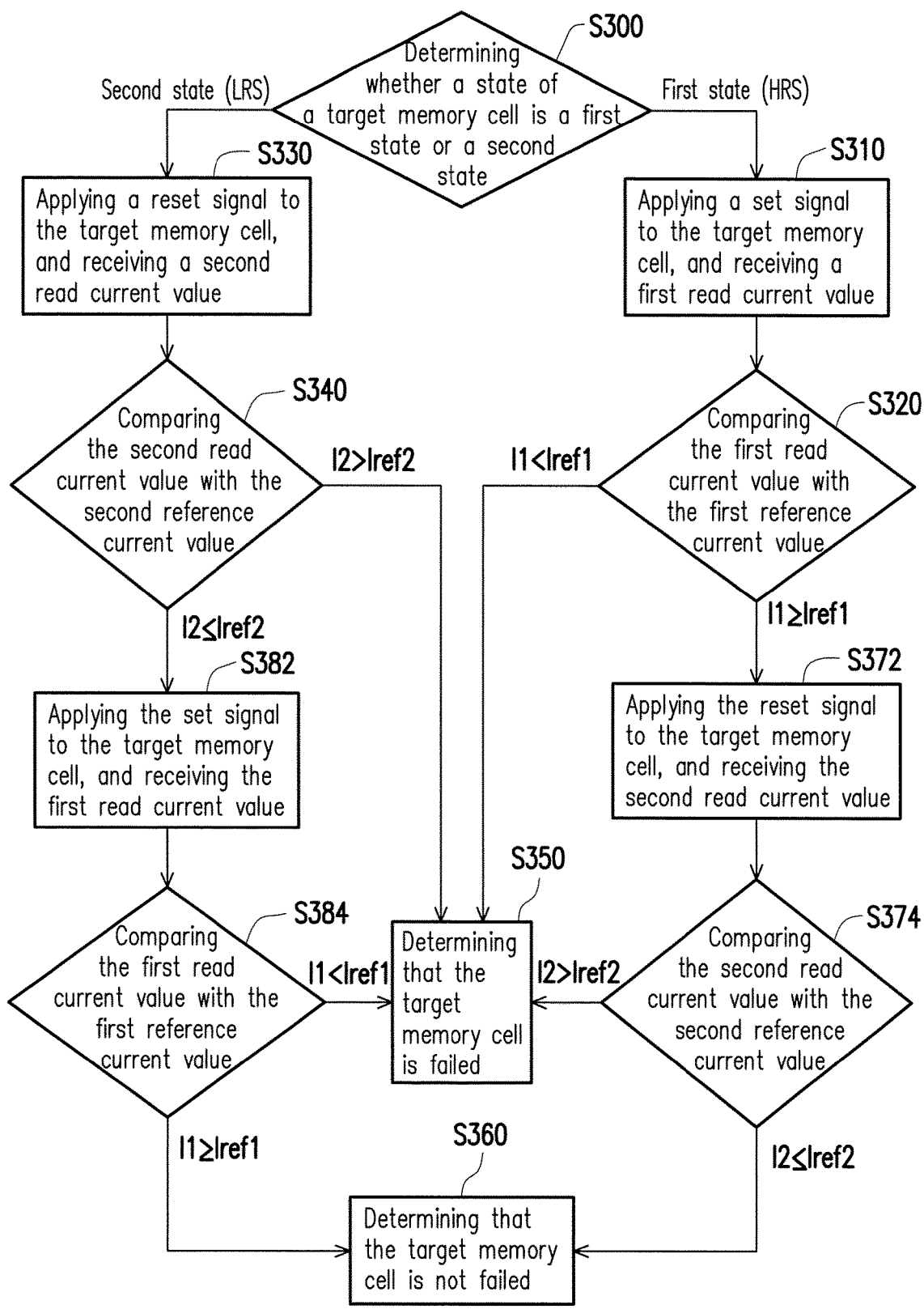
FIG. 4 is a flowchart illustrating steps in a method for testing a memory storage apparatus according to another embodiment of the invention.

FIG. 4 is a flowchart illustrating steps in a method for testing a memory storage apparatus according to another embodiment of the invention. A method for testing a memory storage apparatus is at least applicable to the memory storage apparatus 100 of FIG. 1. Each step in the method for testing of the present embodiment will be described below with reference to each element in the memory storage apparatus 100. In step S300, the memory control circuit 120 determines whether a state of the target memory cell 114 is a first state or a second state. In the present embodiment, the first state is, for example, HRS and the second state is, for example, LRS.

In step S300, if the state of the target memory cell 114 is determined as the first state, the memory control circuit 120 performs step S310. In step S310, the memory control circuit 120 applies the set signal SET to the target memory cell 114. In this case, the target memory cell 114 changes from the first state to the second state. Also, in step S310, the memory control circuit 120 receives the read current having the first read current value I1 from the target memory cell 114. In step S320, the memory control circuit 120 compares the first read current value I1 with the first reference current value Iref1.

In step S320, upon comparison, if the first read current value I1 is less than the first reference current value Iref1 (i.e., I1<Iref1), the memory control circuit 120 performs step S350 and determines that the target memory cell 114 is failed. In the present embodiment, the memory cells determined as failed is screen out and unused in the subsequent data access being performed, so as to improve endurance and retention of the memory storage apparatus 100 overall as well as reliability of memory cells. In step S320, upon comparison, if the first read current value I1 is greater than or equal to the first reference current value Iref1 (i.e., I1≥Iref1), the memory control circuit 120 performs step S372.

In step S372, the memory control circuit 120 applies the reset signal RESET to the target memory cell 114. In this case, the target memory cell 114 changes from the second state to the first state. Also, in step S372, the memory control circuit 120 receives the read current having the second read current value I2 from the target memory cell 114. In step S374, the memory control circuit 120 compares the second read current value I2 with the second reference current value Iref2.

In step S374, upon comparison, if the second read current value I2 is greater than the second reference current value Iref2 (i.e., I2>Iref2), the memory control circuit 120 performs step S350 and determines that the target memory cell 114 is failed. In the present embodiment, the memory cells determined as failed is screen out and unused in the subsequent data access being performed, so as to improve endurance and retention of the memory storage apparatus 100 overall as well as reliability of memory cells. In step S374, upon comparison, if the second read current value I2 is less than or equal to the second reference current value Iref2 (i.e., I2≤Iref2), the memory control circuit 120 performs step S360 and determines that the target memory cell 114 is not failed.

In step S300, if the state of the target memory cell 114 is determined as the second state, the memory control circuit 120 performs step S330. In step S330, the memory control circuit 120 applies the reset signal RESET to the target memory cell 114. In this case, the target memory cell 114 changes from the second state to the first state. Also, in step S330, the memory control circuit 120 receives the read current having the second read current value I2 from the target memory cell 114. In step S340, the memory control circuit 120 compares the second read current value I2 with the second reference current value Iref2.

In step S340, upon comparison, if the second read current value I2 is greater than the second reference current value Iref2 (i.e., I2>Iref2), the memory control circuit 120 performs step S350 and determines that the target memory cell 114 is failed. In the present embodiment, the memory cells determined as failed is screen out and unused in the subsequent data access being performed, so as to improve endurance and retention of the memory storage apparatus 100 overall as well as reliability of memory cells. In step S340, upon comparison, if the second read current value I2 is less than or equal to the second reference current value Iref2 (i.e., I2≤Iref2), the memory control circuit 120 performs step S382.

In step S382, the memory control circuit 120 applies the set signal SET to the target memory cell 114. In this case, the target memory cell 114 changes from the first state to the second state. Also, in step S382, the memory control circuit 120 receives the read current having the first read current value I1 from the target memory cell 114. In step S384, the memory control circuit 120 compares the first read current value I1 with the first reference current value Iref1.

In step S384, upon comparison, if the first read current value I1 is less than the first reference current value Iref1 (i.e., I1<Iref1), the memory control circuit 120 performs step S350 and determines that the target memory cell 114 is failed. In the present embodiment, the memory cells determined as failed is screen out and unused in the subsequent data access being performed, so as to improve endurance and retention of the memory storage apparatus 100 overall as well as reliability of memory cells. In step S384, upon comparison, if the first read current value I1 is greater than or equal to the first reference current value Iref1 (i.e., I1>Iref1), the memory control circuit 120 performs step S360 and determines that the target memory cell 114 is not failed.

In the present embodiment, after passing the test (step S320), the target memory cell 114 applied with the set signal SET is applied with the reset signal RESET again (step S372) so as to confirm whether the target memory cell 114 does pass the test once again (step S374). In the present embodiment, after passing the test (step S340), the target memory cell 114 applied with reset signal RESET is applied with the set signal SET again (step S382) so as to confirm whether the target memory cell 114 does pass the test once again (step S384).

In addition, sufficient teaching, suggestion, and implementation illustration regarding the method for testing the memory storage apparatus in the embodiments of the invention may be obtained from the above embodiments depicted in FIG. 1 to FIG. 3, and thus related description thereof is not repeated hereinafter.

In summary, in the exemplary embodiments of the invention, according to the state of the target memory cell, the memory control circuit decides whether to apply the set signal or the reset signal to the target memory cell for receiving the read current. Then, the memory control circuit determines whether the target memory cell passes the test according to the comparison result of the read current and the reference current. If the target memory cell does not pass the test and thus determined as failed, such target memory cell is screen out and unused in the subsequent data access being performed, so as to improve endurance and retention of the memory storage apparatus overall as well as reliability of memory cells.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory storage apparatus, comprising:
 a memory cell array, comprising a plurality of memory cells, and configured to store data; and
 a memory control circuit, coupled to the memory cell array, and configured to apply one of a set signal and a reset signal to a target memory cell among the memory cells to generate a first read current then apply the other one of the set signal and the reset signal to the target memory cell among the memory cells to generate a second read current, receive the first read current and the second read current of the target memory cell, compare the first read current with a first reference current and compare the second read current with a second reference current to generate a comparison result, and determine whether the target memory cell is failed according to the comparison result,
 wherein the memory storage apparatus is a resistive random access memory.

2. The memory storage apparatus as recited in claim 1, wherein the memory control circuit determines whether a state of the target memory cell is a first state or a second state.

3. The memory storage apparatus as recited in claim 2, wherein if the state of the target memory cell is the first state, the memory control circuit applies the set signal to the target memory cell and the target memory cell changes from the first state to the second state, wherein the first read current has a first read current value and the first reference current has a first reference current value, the memory control circuit compares the first read current value with the first reference current value, and if the first read current value is less than the first reference current value, the memory control circuit determines that the target memory cell is failed.

4. The memory storage apparatus as recited in claim 3, wherein if the first read current value is greater than or equal to the first reference current value, the memory control circuit determines that the target memory cell is not failed.

5. The memory storage apparatus as recited in claim 3, wherein if the first read current value is greater than or equal to the first reference current value, the memory control circuit applies the reset signal to the target memory cell and the target memory cell changes from the second state to the first state, wherein the second read current has a second read current value and the second reference current has a second reference current value, the memory control circuit compares the second read current value with the second reference current value, if the second read current value is greater than the second reference current value, the memory control circuit determines that the target memory cell is failed, and if the second read current value is less than or equal to the second reference current value, the memory control circuit determines that the target memory cell is not failed.

6. The memory storage apparatus as recited in claim 2, wherein if the state of the target memory cell is the second state, the memory control circuit applies the reset signal to the target memory cell and the target memory cell changes from the second state to the first state, wherein the first read current has a second read current value and the first reference current has a second reference current value, the memory control circuit compares the second read current value with the second reference current value, and if the second read current value is greater than the second reference current value, the memory control circuit determines that the target memory cell is failed.

7. The memory storage apparatus as recited in claim 6, wherein and if the second read current value is less than or equal to the second reference current value, the memory control circuit determines that the target memory cell is not failed.

8. The memory storage apparatus as recited in claim 6, wherein if the second read current value is less than or equal to the second reference current value, the memory control circuit applies the set signal to the target memory cell and the target memory cell changes from the first state to the second state, wherein the second read current has a first read current value and the second reference current has a first reference current value, the memory control circuit compares the first read current value with the first reference current value, if the first read current value is less than the first reference current value, the memory control circuit determines that the target memory cell is failed, and if the first read current value is greater than or equal to the first reference current value, the memory control circuit determines that the target memory cell is not failed.

9. A method for testing a memory storage apparatus, wherein the memory storage apparatus comprises a plurality of memory cells, configured to store data, and the method for testing comprises:
 applying one of a set signal and a reset signal to a target memory cell among the memory cells to generate a first read current then applying the other one of the set signal and the reset signal to the target memory cell among the memory cells to generate a second read current;
 receiving the first read current and the second read current of the target memory cell, and comparing the first read current with a first reference current and comparing the second read current with a second reference current to generate a comparison result; and
 determining whether the target memory cell is failed according to the comparison result,
 wherein the memory storage apparatus is a resistive random access memory.

10. The method for testing the memory storage apparatus as recited in claim 9, further comprises:
 determining whether a state of the target memory cell is a first state or a second state.

11. The method for testing the memory storage apparatus as recited in claim 10, wherein if the state of the target memory cell is the first state, the step of applying one of the set signal and the reset signal to the target memory cell among the memory cells to generate the first read current comprises applying the set signal to the target memory cell so the target memory cell changes from the first state to the second state, wherein the first read current has a first read current value and the first reference current has a first reference current value, the step of comparing the first read current with the first reference current comprises comparing the first read current value with the first reference current value, and if the first read current value is less than the first reference current value, the step of determining whether the target memory cell is failed according to the comparison result comprises determining that the target memory cell is failed.

12. The method for testing the memory storage apparatus as recited in claim 11, wherein if the first read current value is greater than or equal to the first reference current value, the step of determining whether the target memory cell is failed according to the comparison result further comprises determining that the target memory cell is not failed.

13. The method for testing the memory storage apparatus as recited in claim 11, wherein if the first read current value is greater than or equal to the first reference current value, the step of applying the other one of the set signal and the reset signal to the target memory cell among the memory cells to generate the second read current further comprises applying the reset signal to the target memory cell so the target memory cell changes from the second state to the first state, wherein the second read current has a second read current value and the second reference current has a second reference current value, the step of comparing the second read current with the second reference current further comprises comparing the second read current value with the second reference current value, and if the second read current value is greater than the second reference current value, the step of determining whether the target memory cell is failed according to the comparison result further comprises determining that the target memory cell is failed, wherein if the second read current value is less than or equal to the second reference current value, the step of determining whether the target memory cell is failed according to the comparison result further comprises determining that the target memory cell is not failed.

14. The method for testing the memory storage apparatus as recited in claim 10, wherein if the state of the target memory cell is the second state, the step of applying one of the set signal and the reset signal to the target memory cell among the memory cells to generate the first read current comprises applying the reset signal to the target memory cell so the target memory cell changes from the second state to the first state, wherein the first read current has a second read current value and the first reference current has a second reference current value, the step of comparing the first read current with the first reference current comprises comparing the second read current value with the second reference current value, and if the second read current value is greater than the second reference current value, the step of determining whether the target memory cell is failed according to the comparison result comprises determining that the target memory cell is failed.

15. The method for testing the memory storage apparatus as recited in claim 14, wherein if the second read current value is less than or equal to the second reference current value, the step of determining whether the target memory cell is failed according to the comparison result further comprises determining that the target memory cell is not failed.

16. The method for testing the memory storage apparatus as recited in claim 14, wherein if the second read current value is less than or equal to the second reference current value, the step of applying the other one of the set signal and the reset signal to the target memory cell among the memory cells to generate the second read current further comprises applying the set signal to the target memory cell so the target memory cell changes from the first state to the second state, wherein the second read current has a first read current value and the second reference current has a first reference current value, the step of comparing the second read current with the second reference current further comprises comparing the first read current value with the first reference current value, if the first read current value is less than the first reference current value, the step of determining whether the target memory cell is failed according to the comparison result further comprises determining that the target memory cell is failed, if the first read current value is greater than or equal to the first reference current value, the step of determining whether the target memory cell is failed according to the comparison result further comprises determining that the target memory cell is not failed.

* * * * *